United States Patent
Lang et al.

(10) Patent No.: US 8,383,192 B2
(45) Date of Patent: *Feb. 26, 2013

(54) PROCESS FOR MAKING CONTAINED LAYERS AND DEVICES MADE WITH SAME

(75) Inventors: Charles D. Lang, Goleta, CA (US); Stephen Sorich, Goleta, CA (US); Charles Kenneth Taylor, West Deptford, NJ (US); Douglas Robert Anton, Wilmington, DE (US); Alberto Goenaga, Simi Valley, CA (US); Paul Anthony Sant, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/080,361

(22) Filed: Apr. 5, 2011

(65) Prior Publication Data

US 2011/0183268 A1 Jul. 28, 2011

Related U.S. Application Data

(62) Division of application No. 11/401,151, filed on Apr. 10, 2006, now Pat. No. 8,124,172.

(60) Provisional application No. 60/751,549, filed on Mar. 2, 2006.

(51) Int. Cl.
*B05D 5/06* (2006.01)
(52) U.S. Cl. ......................................................... 427/64
(58) Field of Classification Search ...................... 427/64
See application file for complete search history.

(56) References Cited

U.S. PATENT DOCUMENTS

| 5,435,887 A | 7/1995 | Rothschild et al. |
| 5,922,481 A | 7/1999 | Etzbach et al. |
| 6,303,238 B1 | 10/2001 | Thompson et al. |
| 6,670,645 B2 | 12/2003 | Grushin et al. |
| 2003/0017360 A1 | 1/2003 | Tai et al. |
| 2003/0129321 A1 | 7/2003 | Aoki |
| 2003/0222250 A1 | 12/2003 | Hsu |
| 2004/0079940 A1 | 4/2004 | Redecker et al. |
| 2004/0094768 A1 | 5/2004 | Yu et al. |
| 2004/0102577 A1 | 5/2004 | Hsu et al. |

(Continued)

FOREIGN PATENT DOCUMENTS

| WO | WO 00/70655 A2 | 11/2000 |
| WO | WO 01/41512 A1 | 6/2001 |

(Continued)

OTHER PUBLICATIONS

Micropatterning of Alkyl- and Fluoroalkylsilane Self-Assembled Monolayers Using Vacuum Ultraviolet Light, Sugimura et al., Langmuir, 2000, vol. 16, pp. 885-888.

(Continued)

*Primary Examiner* — James Lin
*Assistant Examiner* — Robert Vetere

(57) ABSTRACT

There is provided a process for forming a contained second layer over a first layer, including the steps:
  forming the first layer having a first surface energy;
  treating the first layer with a reactive surface-active composition to form a treated first layer having a second surface energy which is lower than the first surface energy;
  exposing the treated first layer with radiation; and
  forming the second layer.
There is also provided an organic electronic device made by the process.

6 Claims, 3 Drawing Sheets

U.S. PATENT DOCUMENTS

| | | |
|---|---|---|
| 2004/0127637 A1 | 7/2004 | Hsu et al. |
| 2004/0175646 A1 | 9/2004 | Hatanaka et al. |
| 2004/0222412 A1* | 11/2004 | Bai et al. .......................... 257/40 |
| 2005/0003202 A1 | 1/2005 | Gerber .......................... 428/413 |
| 2005/0051770 A1 | 3/2005 | Ando et al. ..................... 257/40 |
| 2005/0236614 A1 | 10/2005 | Parker |

FOREIGN PATENT DOCUMENTS

| | | |
|---|---|---|
| WO | WO 03/008424 A1 | 1/2003 |
| WO | WO 03/040257 A1 | 5/2003 |
| WO | WO 03/063555 A1 | 7/2003 |
| WO | WO 03/091688 A2 | 11/2003 |
| WO | WO 2004/016710 A1 | 2/2004 |
| WO | 2004/042474 A1 | 5/2004 |

OTHER PUBLICATIONS

European Search Report, PCT/US2006013118, dated Apr. 18, 2011.
International Search Report in PCT/US06/13118, PCT Counterpart of present U.S. Appl. No. 11/401,151, William Phillip Fletcher III, Authorized Officer, May 28, 2008.
Copending U.S. Appl. No. 11/444,655, filed Jun. 1, 2006, LeCloux et al.
Braun et al., Visible Light Emission From Semiconducting Polymer Diodes, Appl. Phys. Lett., 1991, vol. 58:1982-1984.
CRC Handbook of Chemistry and Physics, $81^{st}$ Edition, 2000-2001 (Book not Included).
Y. Wang, Kirk-Othmer Encyclopedia of Chemical Technology, Fourth Edition, 1996, vol. 18:837-860.

* cited by examiner

PROCESS FOR MAKING CONTAINED LAYERS AND DEVICES MADE WITH SAME

RELATED APPLICATION DATA

This application claims priority under 35 U.S.C. §120 to U.S. application Ser. No. 11/401,151, filed Apr. 10, 2006 now U.S. Pat. No. 8,124,172, which claims priority under 35 U.S.C. §119(e) from U.S. Provisional Application No. 60/751,549, filed on Mar. 2, 2006, which are incorporated by reference herein in its entirety.

BACKGROUND INFORMATION

1. Field of the Disclosure

This disclosure relates in general to a process for making an electronic device. It further relates to the device made by the process.

2. Description of the Related Art

Electronic devices utilizing organic active materials are present in many different kinds of electronic equipment. In such devices, an organic active layer is sandwiched between two electrodes.

One type of electronic device is an organic light emitting diode (OLED). OLEDs are promising for display applications due to their high power-conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

Current research in the production of full-color OLEDs is directed toward the development of cost effective, high throughput processes for producing color pixels. For the manufacture of monochromatic displays by liquid processing, spin-coating processes have been widely adopted (see, e.g., David Braun and Alan J. Heeger, Appl. Phys. Letters 58, 1982 (1991)). However, manufacture of full-color displays requires certain modifications to procedures used in manufacture of monochromatic displays. For example, to make a display with full-color images, each display pixel is divided into three subpixels, each emitting one of the three primary display colors, red, green, and blue. This division of full-color pixels into three subpixels has resulted in a need to modify current processes to prevent the spreading of the liquid colored materials (i.e., inks) and color mixing.

Several methods for providing ink containment are described in the literature. These are based on containment structures, surface tension discontinuities, and combinations of both. Containment structures are geometric obstacles to spreading: pixel wells, banks, etc. In order to be effective these structures must be large, comparable to the wet thickness of the deposited materials. When the emissive ink is printed into these structures it wets onto the structure surface, so thickness uniformity is reduced near the structure. Therefore the structure must be moved outside the emissive "pixel" region so the non-uniformities are not visible in operation. Due to limited space on the display (especially high-resolution displays) this reduces the available emissive area of the pixel. Practical containment structures generally have a negative impact on quality when depositing continuous layers of the charge injection and transport layers. Consequently, all the layers must be printed.

In addition, surface tension discontinuities are obtained when there are either printed or vapor deposited regions of low surface tension materials. These low surface tension materials generally must be applied before printing or coating the first organic active layer in the pixel area. Generally the use of these treatments impacts the quality when coating continuous non-emissive layers, so all the layers must be printed.

An example of a combination of two ink containment techniques is $CF_4$-plasma treatment of photoresist bank structures (pixel wells, channels). Generally, all of the active layers must be printed in the pixel areas.

All these containment methods have the drawback of precluding continuous coating. Continuous coating of one or more layers is desirable as it can result in higher yields and lower equipment cost. There exists, therefore, a need for improved processes for forming electronic devices.

SUMMARY

There is provided a process for forming a contained second layer over a first layer, said process comprising:
  forming the first layer having a first surface energy;
  treating the first layer with a reactive surface-active composition to form a treated first layer having a second surface energy which is lower than the first surface energy;
  exposing the treated first layer with radiation; and
  forming the second layer.

There is provided a process for making an organic electronic device comprising a first organic active layer and a second organic active layer positioned over an electrode, said process comprising:
  forming the first organic active layer having a first surface energy over the electrode;
  treating the first organic active layer with a reactive surface-active composition to form a treated first organic active layer having a second surface energy which is lower than the first surface energy;
  exposing the treated first organic active layer with radiation; and
  forming the second organic active layer.

There is also provided an organic electronic device comprising a first organic active layer and a second organic active layer positioned over an electrode, and further comprising a reactive surface-active composition between the first organic active layer and the second organic active layer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
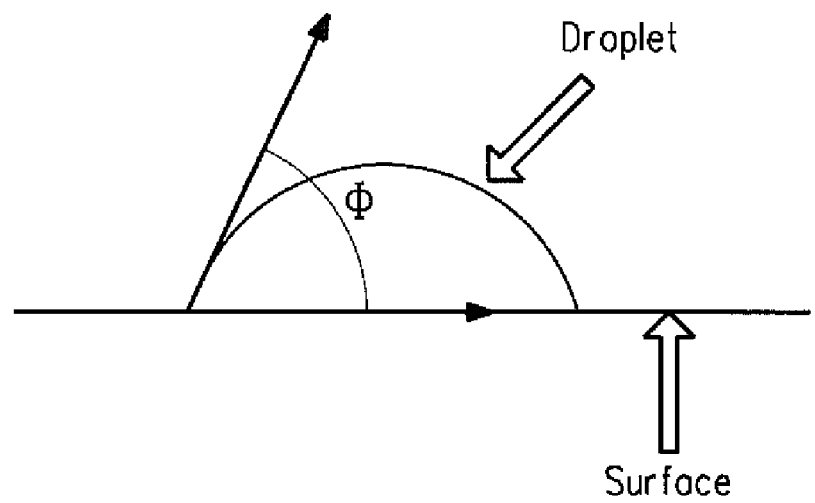
FIG. 1 includes a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a process for forming a contained second layer over a first layer, said process comprising:
forming the first layer having a first surface energy;
treating the first layer with a reactive surface-active composition to form a treated first layer having a second surface energy which is lower than the first surface energy;
exposing the treated first layer with radiation; and
applying the second layer over the treated and exposed first layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Reactive Surface-active composition, the Process, the Organic Electronic Device, and finally Examples.

1. Definitions and Clarification of Terms

Before addressing details of embodiments described below, some terms are defined or clarified.

The term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "contained" when referring to a layer, is intended to mean that the layer does not spread significantly beyond the area where it is deposited. The layer can be contained by surface energy affects or a combination of surface energy affects and physical barrier structures.

The term "electrode" is intended to mean a member or structure configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "fluorinated" when referring to an organic compound, is intended to mean that one or more of the hydrogen atoms in the compound have been replaced by fluorine. The term encompasses partially and fully fluorinated materials.

The term(s) "radiating/radiation" means adding energy in any form, including heat in any form, the entire electromagnetic spectrum, or subatomic particles, regardless of whether such radiation is in the form of rays, waves, or particles.

The term "reactive surface-active composition" is intended to mean a composition that comprises at least one material which is radiation sensitive, and when the composition is applied to a layer, the surface energy of that layer is reduced. Exposure of the reactive surface-active composition to radiation results in the change in at least one physical property of the composition. The term is abbreviated "RSA", and refers to the composition both before and after exposure to radiation.

The term "radiation sensitive" when referring to a material, is intended to mean that exposure to radiation results in at least one chemical, physical, or electrical property of the material.

The term "surface energy" is the energy required to create a unit area of a surface from a material. A characteristic of surface energy is that liquid materials with a given surface energy will not wet surfaces with a lower surface energy.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer.

The term "liquid composition" is intended to mean a liquid medium in which a material is dissolved to form a solution, a liquid medium in which a material is dispersed to form a dispersion, or a liquid medium in which a material is suspended to form a suspension or an emulsion. "Liquid medium" is intended to mean a material that is liquid without the addition of a solvent or carrier fluid, i.e., a material at a temperature above its solidification temperature.

The term "liquid containment structure" is intended to mean a structure within or on a workpiece, wherein such one or more structures, by itself or collectively, serve a principal function of constraining or guiding a liquid within an area or region as it flows over the workpiece. A liquid containment structure can include cathode separators or a well structure.

The term "liquid medium" is intended to mean a liquid material, including a pure liquid, a combination of liquids, a solution, a dispersion, a suspension, and an emulsion. Liquid medium is used regardless whether one or more solvents are present.

As used herein, the term "over" does not necessarily mean that a layer, member, or structure is immediately next to or in contact with another layer, member, or structure. There may be additional, intervening layers, members or structures.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or"

refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Reactive Surface-Active Composition

The reactive surface-active composition ("RSA") is a radiation-sensitive composition. When exposed to radiation, at least one physical property and/or chemical property of the RSA is changed such that the exposed and unexposed areas can be physically differentiated. Treatment with the RSA lowers the surface energy of the material being treated.

In one embodiment, the RSA is a radiation-hardenable composition. In this case, when exposed to radiation, the RSA can become more soluble or dispersable in a liquid medium, less tacky, less soft, less flowable, less liftable, or less absorbable. Other physical properties may also be affected.

In one embodiment, the RSA is a radiation-softenable composition. In this case, when exposed to radiation, the RSA can become less soluble or dispersable in a liquid medium, more tacky, more soft, more flowable, more liftable, or more absorbable. Other physical properties may also be affected.

The radiation can be any type of radiation to which results in a physical change in the RSA. In one embodiment, the radiation is selected from infrared radiation, visible radiation, ultraviolet radiation, and combinations thereof.

Physical differentiation between areas of the RSA exposed to radiation and areas not exposed to radiation, hereinafter referred to as "development," can be accomplished by any known technique. Such techniques have been used extensively in the photoresist art. Examples of development techniques include, but are not limited to, treatment with a liquid medium, treatment with an absorbent material, treatment with a tacky material, and the like.

In one embodiment, the RSA consists essentially of one or more radiation-sensitive materials. In one embodiment, the RSA consists essentially of a material which, when exposed to radiation, hardens, or becomes less soluble, swellable, or dispersible in a liquid medium, or becomes less tacky or absorbable. In one embodiment, the RSA consists essentially of a material having radiation polymerizable groups. Examples of such groups include, but are not limited to olefins, acrylates, methacrylates and vinyl ethers. In one embodiment, the RSA material has two or more polymerizable groups which can result in crosslinking. In one embodiment, the RSA consists essentially of a material which, when exposed to radiation, softens, or becomes more soluble, swellable, or dispersible in a liquid medium, or becomes more tacky or absorbable. In one embodiment, the RSA consists essentially of at least one polymer which undergoes backbone degradation when exposed to deep UV radiation, having a wavelength in the range of 200-300 nm. Examples of polymers undergoing such degradation include, but are not limited to, polyacrylates, polymethacrylates, polyketones, polysulfones, copolymers thereof, and mixtures thereof.

In one embodiment, the RSA consists essentially of at least one reactive material and at least one radiation-sensitive material. The radiation-sensitive material, when exposed to radiation, generates an active species that initiates the reaction of the reactive material. Examples of radiation-sensitive materials include, but are not limited to, those that generate free radicals, acids, or combinations thereof. In one embodiment, the reactive material is polymerizable or crosslinkable. The material polymerization or crosslinking reaction is initiated or catalyzed by the active species. The radiation-sensitive material is generally present in amounts from 0.001% to 10.0% based on the total weight of the RSA.

In one embodiment, the RSA consists essentially of a material which, when exposed to radiation, hardens, or becomes less soluble, swellable, or dispersible in a liquid medium, or becomes less tacky or absorbable. In one embodiment, the reactive material is an ethylenically unsaturated compound and the radiation-sensitive material generates free radicals. Ethylenically unsaturated compounds include, but are not limited to, acrylates, methacrylates, vinyl compounds, and combinations thereof. Any of the known classes of radiation-sensitive materials that generate free radicals can be used. Examples of radiation-sensitive materials which generate free radicals include, but are not limited to, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, and Michler's ketone. Alternatively, the radiation sensitive material may be a mixture of compounds, one of which provides the free radicals when caused to do so by a sensitizer activated by radiation. In one embodiment, the radiation sensitive material is sensitive to visible or ultraviolet radiation.

In one embodiment, the reactive material can undergo polymerization initiated by acid, and the radiation-sensitive material generates acid. Examples of such reactive materials include, but are not limited to, epoxies. Examples of radiation-sensitive materials which generate acid, include, but are not limited to, sulfonium and iodonium salts, such as diphenyliodonium hexafluorophosphate.

In one embodiment, the RSA consists essentially of a material which, when exposed to radiation, softens, or becomes more soluble, swellable, or dispersible in a liquid medium, or becomes more tacky or absorbable. In one embodiment, the reactive material is a phenolic resin and the radiation-sensitive material is a diazonaphthoquinone.

Other radiation-sensitive systems that are known in the art can be used as well.

In one embodiment, the RSA comprises a fluorinated material. In one embodiment, the RSA comprises an unsaturated material having one or more fluoroalkyl groups. In one embodiment, the fluoroalkyl groups have from 2-20 carbon atoms. In one embodiment, the RSA is a fluorinated acrylate, a fluorinated ester, or a fluorinated olefin monomer. Examples of commercially available materials which can be used as RSA materials, include, but are not limited to, Zonyl® 8857A, a fluorinated unsaturated ester monomer available from E. I. du Pont de Nemours and Company (Wilmington, Del.), and 3,3,4,4,5,5,6,6,7,7,8,8,9,9,10,10,11,11,12,12,12-eneicosafluorododecyl acrylate ($H_2C\!=\!CHCO_2CH_2CH_2(CF_2)_9CF_3$) available from Sigma-Aldrich Co. (St. Louis, Mo.).

3. Process

In the process provided herein, a first layer is formed, the first layer is treated with a reactive surface-active composition ("RSA"), the treated first layer is exposed to radiation, and a second layer is formed over the treated and exposed first layer.

In one embodiment, the first layer is a substrate. The substrate can be inorganic or organic. Examples of substrates include, but are not limited to, glasses, ceramics, and polymeric films, such as polyester and polyimide films.

In one embodiment, the first layer is deposited on a substrate. The first layer can be patterned or unpatterned. In one embodiment, the first layer is an organic active layer in an electronic device.

The first layer can be formed by any deposition technique, including vapor deposition techniques, liquid deposition techniques, and thermal transfer techniques. In one embodiment, the first layer is deposited by a liquid deposition technique, followed by drying. In this case, a first material is dissolved or dispersed in a liquid medium. The liquid deposition method may be continuous or discontinuous. Continuous liquid deposition techniques, include but are not limited to, spin coating, roll coating, curtain coating, dip coating, slot-die coating, spray coating, and continuous nozzle coating. Discontinuous liquid deposition techniques include, but are not limited to, ink jet printing, gravure printing, flexographic printing and screen printing. In one embodiment, the first layer is deposited by a continuous liquid deposition technique. The drying step can take place at room temperature or at elevated temperatures, so long as the first material and any underlying materials are not damaged.

The first layer is treated with an RSA. The treatment can be coincidental with or subsequent to the formation of the first layer.

In one embodiment, the RSA treatment is coincidental with the formation of the first organic active layer. In one embodiment, the RSA is added to the liquid composition used to form the first layer. When the deposited composition is dried to form a film, the RSA migrates to the air interface, i.e., the top surface, of the first layer in order to reduce the surface energy of the system.

In one embodiment, the RSA treatment is subsequent to the formation of the first layer. In one embodiment, the RSA is applied as a separate layer overlying, and in direct contact with, the first layer.

In one embodiment, the RSA is applied without adding it to a solvent. In one embodiment, the RSA is applied by vapor deposition. In one embodiment, the RSA is a liquid at room temperature and is applied by liquid deposition over the first layer. The liquid RSA may be film-forming or it may be absorbed or adsorbed onto the surface of the first layer. In one embodiment, the liquid RSA is cooled to a temperature below its melting point in order to form a second layer over the first layer. In one embodiment, the RSA is not a liquid at room temperature and is heated to a temperature above its melting point, deposited on the first layer, and cooled to room temperature to form a second layer over the first layer. For the liquid deposition, any of the methods described above may be used.

In one embodiment, the RSA is deposited from a second liquid composition. The liquid deposition method can be continuous or discontinuous, as described above. In one embodiment, the RSA liquid composition is deposited using a continuous liquid deposition method. The choice of liquid medium for depositing the RSA will depend on the exact nature of the RSA material itself. In one embodiment, the RSA is a fluorinated material and the liquid medium is a fluorinated liquid. Examples of fluorinated liquids include, but are not limited to, perfluorooctane, trifluorotoluene, and hexafluoroxylene.

After the RSA treatment, the treated first layer is exposed to radiation. The type of radiation used will depend upon the sensitivity of the RSA as discussed above. The exposure can be a blanket, overall exposure, or the exposure can be patternwise. As used herein, the term "patternwise" indicates that only selected portions of a material or layer are exposed. Patternwise exposure can be achieved using any known imaging technique. In one embodiment, the pattern is achieved by exposing through a mask. In one embodiment, the pattern is achieved by exposing only select portions with a laser. The time of exposure can range from seconds to minutes, depending upon the specific chemistry of the RSA used. When lasers are used, much shorter exposure times are used for each individual area, depending upon the power of the laser. The exposure step can be carried out in air or in an inert atmosphere, depending upon the sensitivity of the materials.

In one embodiment, the radiation is selected from the group consisting of ultra-violet radiation (10-390 nm), visible radiation (390-770 nm), infrared radiation (770-$10^6$ nm), and combinations thereof, including simultaneous and serial treatments. In one embodiment, the radiation is thermal radiation. In one embodiment, the exposure to radiation is carried out by heating. The temperature and duration for the heating step is such that at least one physical property of the RSA is changed, without damaging any underlying layers. In one embodiment, the heating temperature is less than 250° C. In one embodiment, the heating temperature is less than 150° C.

In one embodiment, the radiation is ultraviolet or visible radiation. In one embodiment, the radiation is applied patternwise, resulting in exposed regions of RSA and unexposed regions of RSA.

In one embodiment, after patternwise exposure to radiation, the first layer is treated to remove either the exposed or unexposed regions of the RSA. Patternwise exposure to radiation and treatment to remove exposed or unexposed regions is well known in the art of photoresists.

In one embodiment, the exposure of the RSA to radiation results in a change in the solubility or dispersibility of the RSA in solvents. When the exposure is carried out patternwise, this can be followed by a wet development treatment. The treatment usually involves washing with a solvent which dissolves, disperses or lifts off one type of area. In one embodiment, the patternwise exposure to radiation results in insolubilization of the exposed areas of the RSA, and treatment with solvent results in removal of the unexposed areas of the RSA.

In one embodiment, the exposure of the RSA to visible or UV radiation results in a reaction which decreases the volatility of the RSA in exposed areas. When the exposure is carried out patternwise, this can be followed by a thermal development treatment. The treatment involves heating to a temperature above the volatilization or sublimation temperature of the unexposed material and below the temperature at which the material is thermally reactive. For example, for a polymerizable monomer, the material would be heated at a temperature above the sublimation temperature and below the thermal polymerization temperature. It will be understood that RSA materials which have a temperature of thermal reactivity that is close to or below the volatilization temperature, may not be able to be developed in this manner.

In one embodiment, the exposure of the RSA to radiation results in a change in the temperature at which the material melts, softens or flows. When the exposure is carried out patternwise, this can be followed by a dry development treatment. A dry development treatment can include contacting an outermost surface of the element with an absorbent surface to absorb or wick away the softer portions. This dry development can be carried out at an elevated temperature, so long as it does not further affect the properties of the originally unexposed areas.

After treatment with the RSA, and exposure to radiation, the first layer has a lower surface energy than prior to treatment. In the case where part of the RSA is removed after exposure to radiation, the areas of the first layer that are covered by the RSA will have a lower surface energy that the areas that are not covered by the RSA.

One way to determine the relative surface energies, is to compare the contact angle of a given liquid on the first organic active layer before and after treatment with the RSA. As used herein, the term "contact angle" is intended to mean the angle $\Phi$ shown in FIG. 1. For a droplet of liquid medium, angle $\Phi$ is defined by the intersection of the plane of the surface and a line from the outer edge of the droplet to the surface. Furthermore, angle $\Phi$ is measured after the droplet has reached an equilibrium position on the surface after being applied, i.e. "static contact angle". A variety of manufacturers make equipment capable of measuring contact angles.

The second layer is then applied over the RSA-treated first layer. The second layer can be applied by any deposition technique. In one embodiment, the second layer is applied by a liquid deposition technique. In this case, a second material is dissolved or dispersed in a liquid medium, applied over the RSA-treated first layer, and dried to form the second layer.

In one embodiment, the RSA is patterned and the second layer is applied using a continuous liquid deposition technique. In one embodiment, the second layer is applied using a discontinuous liquid deposition technique.

In one embodiment, the RSA is unpatterned and the second layer is applied using a discontinuous liquid deposition technique.

In one embodiment, the first layer is applied over a liquid containment structure. It may be desired to use a structure that is inadequate for complete containment, but that still allows adjustment of thickness uniformity of the printed layer. In this case it may be desirable to control wetting onto the thickness-tuning structure, providing both containment and uniformity. It is then desirable to be able to modulate the contact angle of the emissive ink. Most surface treatments used for containment (e.g., CF4 plasma) do not provide this level of control.

In one embodiment, the first layer is applied over a so-called bank structure. Bank structures are typically formed from photoresists, organic materials (e.g., polyimides), or inorganic materials (oxides, nitrides, and the like). Bank structures may be used for containing the first layer in its liquid form, preventing color mixing; and/or for improving the thickness uniformity of the first layer as it is dried from its liquid form; and/or for protecting underlying features from contact by the liquid. Such underlying features can include conductive traces, gaps between conductive traces, thin film transistors, electrodes, and the like. It is often desirable to form regions on the bank structures possessing different surface energies to achieve two or more purposes (e.g., preventing color mixing and also improving thickness uniformity). One approach is to provide a bank structure with multiple layers, each layer having a different surface energy. A more cost effective way to achieve this modulation of surface energy is to control surface energy via modulation of the radiation used to cure a RSA. This modulation of curing radiation can be in the form of energy dosage (power*exposure time), or by exposing the RSA through a photomask pattern that simulates a different surface energy (e.g., expose through a half-tone density mask).

In one embodiment of the process provided herein, the first and second layers are organic active layers. The first organic active layer is formed over a first electrode, the first organic active layer is treated with a reactive surface-active composition to reduce the surface energy of the layer, and the second organic active layer is formed over the treated first organic active layer.

In one embodiment, the first organic active layer is formed by liquid deposition of a liquid composition comprising the first organic active material and a liquid medium. The liquid composition is deposited over the first electrode, and then dried to form a layer. In one embodiment, the first organic active layer is formed by a continuous liquid deposition method. Such methods may result in higher yields and lower equipment costs.

In one embodiment, the RSA treatment is subsequent to the formation of the first organic active layer. In one embodiment, the RSA is is applied as a separate layer overlying, and in direct contact with, the first organic active layer. In one embodiment, the RSA is deposited from a second liquid composition. The liquid deposition method can be continuous or discontinuous, as described above. In one embodiment, the RSA liquid composition is deposited using a continuous liquid deposition method.

After the RSA treatment, the treated first organic active layer is exposed to radiation. The type of radiation used will depend upon the sensitivity of the RSA as discussed above. The exposure can be a blanket, overall exposure, or the exposure can be patternwise.

In one embodiment, the exposure of the RSA to radiation results in a change in solubility or dispersibility of the RSA in a liquid medium. In one embodiment, the exposure is carried out patternwise. This can be followed by treating the RSA with a liquid medium, to remove either the exposed or unexposed portions of the RSA. In one embodiment, the RSA is radiation-hardenable and the unexposed portions are removed by the liquid medium.

4. Organic Electronic Device

The process will be further described in terms of its application in an electronic device, although it is not limited to such application.

Figure 2:
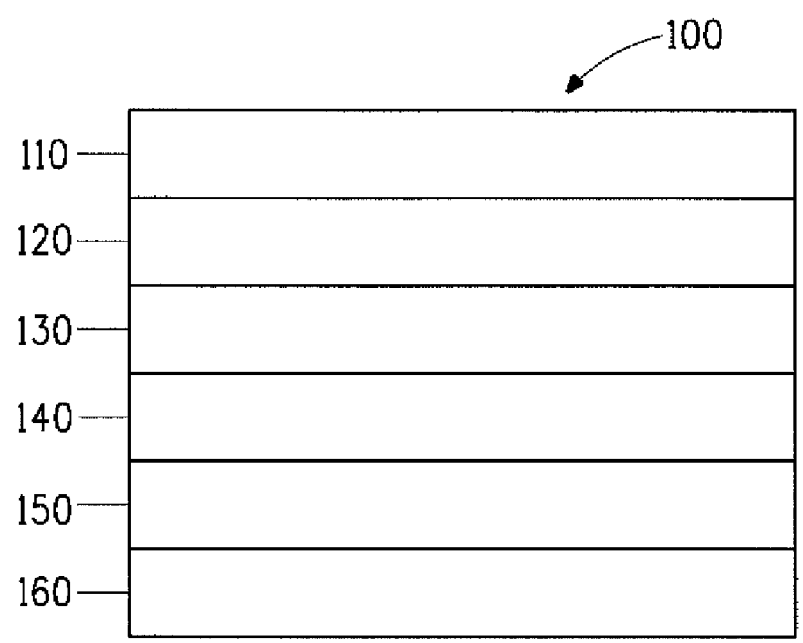
FIG. 2 includes an illustration of an organic electronic device.

FIG. 2 is an exemplary electronic device, an organic light-emitting diode (OLED) display that includes at least two organic active layers positioned between two electrical contact layers. The electronic device 100 includes one or more layers 120 and 130 to facilitate the injection of holes from the anode layer 110 into the photoactive layer 140. In general, when two layers are present, the layer 120 adjacent the anode is called the hole injection layer or buffer layer. The layer 130 adjacent to the photoactive layer is called the hole transport layer. An optional electron transport layer 150 is located between the photoactive layer 140 and a cathode layer 160. Depending on the application of the device 100, the photoactive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). The device is not limited with respect to system, driving method, and utility mode.

For multicolor devices, the photoactive layer 140 is made up different areas of at least three different colors. The areas of different color can be formed by printing the separate colored areas. Alternatively, it can be accomplished by forming an overall layer and doping different areas of the layer with emissive materials with different colors. Such a process has been described in, for example, published U.S. patent application 2004-0094768.

The new process described herein can be used for any successive pairs of organic layers in the device, where the second layer is to be contained in a specific area. In one embodiment of the new process, the second organic active layer is the photoactive layer 140, and the first organic active layer is the device layer applied just before layer 140. In many cases the device is constructed beginning with the anode layer. When the hole transport layer 130 is present, the RSA treatment would be applied to layer 130 prior to applying the photoactive layer 140. When layer 130 was not present, the RSA treatment would be applied to layer 120. In the case where the device was constructed beginning with the cathode, the RSA treatment would be applied to the electron transport layer 150 prior to applying the photoactive layer 140.

In one embodiment, the anode 110 is formed in a pattern of parallel stripes. The buffer layer 120 and, optionally, the hole transport layer 130 are formed as continuous layers over the anode 110. The RSA is applied as a separate layer directly over layer 130 (when present) or layer 120 (when layer 130 is not present). The RSA is exposed in a pattern such that the areas between the anode stripes and the outer edges of the anode stripes are exposed.

The layers in the device can be made of any materials which are known to be useful in such layers. The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 160. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 functions to facilitate injection of holes into the photoactive layer and to smoothen the anode surface to prevent shorts in the device. The buffer layer is typically formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The buffer layer 120 can comprise charge transfer compounds, and the like, such as copper phthalocyanine and the tetrathiafulvalene-tetracyanoquinodimethane system (TTF-TCNQ). In one embodiment, the buffer layer 120 is made from a dispersion of a conducting polymer and a colloid-forming polymeric acid. Such materials have been described in, for example, published U.S. patent applications 2004-0102577 and 2004-0127637.

The buffer layer 120 can be applied by any deposition technique. In one embodiment, the buffer layer is applied by a solution deposition method, as described above. In one embodiment, the buffer layer is applied by a continuous solution deposition method.

Examples of hole transport materials for optional layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MT-DATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N, N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

The hole transport layer 130 can be applied by any deposition technique. In one embodiment, the hole transport layer is applied by a solution deposition method, as described above. In one embodiment, the hole transport layer is applied by a continuous solution deposition method.

Any organic electroluminescent ("EL") material can be used in the photoactive layer 140, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The photoactive layer 140 can be applied by any deposition technique. In one embodiment, the photoactive layer is applied by a solution deposition method, as described above. In one embodiment, the photoactive layer is applied by a continuous solution deposition method.

Optional layer 150 can function both to facilitate electron injection/transport, and can also serve as a confinement layer to prevent quenching reactions at layer interfaces. More specifically, layer 150 may promote electron mobility and reduce the likelihood of a quenching reaction if layers 140 and 160 would otherwise be in direct contact. Examples of materials for optional layer 150 include, but are not limited to, metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 150 may be inorganic and comprise BaO, LiF, $Li_2O$, or the like.

The cathode 160, is an electrode that is particularly efficient for injecting electrons or negative charge carriers. The cathode layer 160 can be any metal or nonmetal having a lower work function than the first electrical contact layer (in this case, the anode layer 110). In one embodiment, the term "lower work function" is intended to mean a material having a work function no greater than about 4.4 eV. In one embodiment, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 160 include, but are not limited to, barium, lithium, cerium, cesium, europium, rubidium, yttrium, magnesium, samarium, and alloys and combinations thereof.

The cathode layer 160 is usually formed by a chemical or physical vapor deposition process.

In other embodiments, additional layer(s) may be present within organic electronic devices.

The different layers may have any suitable thickness. Inorganic anode layer 110 is usually no greater than approximately 500 nm, for example, approximately 10-200 nm; buffer layer 120, and hole transport layer 130 are each usually no greater than approximately 250 nm, for example, approximately 50-200 nm; photoactive layer 140, is usually no greater than approximately 1000 nm, for example, approximately 50-80 nm; optional layer 150 is usually no greater than approximately 100 nm, for example, approximately 20-80 nm; and cathode layer 160 is usually no greater than approximately 100 nm, for example, approximately 1-50 nm. If the anode layer 110 or the cathode layer 160 needs to transmit at least some light, the thickness of such layer may not exceed approximately 100 nm.

EXAMPLES

The concepts described herein will be further described in the following examples, which do not limit the scope of the invention described in the claims.

Example 1

Example 1 demonstrates an RSA treatment that is coincidental with the formation of the first layer. The first layer is an organic active layer.

Coating 1: A first organic active layer of Material A (a cross-linkable hole transport material from Sumitomo) was spin-coated from p-xylene onto a glass slide.

Coating 2: A first organic active layer was made from a solution containing 95% Material A and 5% of a fluorinated unsaturated ester monomer as an RSA (Zonyl® 8857A, from E. I. du Pont de Nemours and Company, Wilmington, Del.) by spin-coating onto a glass slide.

Both coatings were dried at 130 C on a hot plate in air. Spin coating conditions were adjusted to provide films with similar thickness after drying. The coated materials were thermally cured in a convection oven with a nitrogen atmosphere at 200° C. for 30 minutes. An emissive ink made of BH052 and BH140 (Idemitsu,) in a ratio of 8:92, at 1.5% total solids, in anisole, was printed onto each of the coatings using a MicroFab printer, with a stage temperature of 50° C. Spreading of the ink on the two surfaces was compared by measuring the diameter of the printed drops after drying. The ink spread 7% less on coating 2 containing the RSA vs. coating 1 devoid of RSA. The contact angle of anisole was about 9 degrees on coating 1, and about 15 degrees on the surface of coating 2 containing Zonyl® 8857A.

Example 2

Example 2 demonstrates an RSA treatment that is subsequent to the formation of the first layer. The first layer is an organic active layer.

Coatings of Material A were prepared on glass slides and cured at 200° C. for 30 minutes in a convection oven with a nitrogen atmosphere. A solution of a fluorinated acrylate monomer as an RSA (Zonyl® TA-N, from E. I. du Pont de Nemours and Company, Wilmington, Del.) was spin-coated onto the cured Material A surface. The RSA solution was about 20% solids in hexafluoropropoxybenzene. The RSA was cured by heating at 130° C. on a hot plate in air. Any uncured RSA was rinsed off by soaking in trifluorotoluene in a petri dish for 15 minutes, and dried at ambient temperature in air. The contact angle of the cured, uncoated Material A was measured as about 9 degrees using anisole. The contact angle of the cured, uncoated Material A was identical within experimental error if the surface was simply rinsed with trifluorotoluene (no RSA coating). The contact angle was identical within experimental error if the RSA was coated onto the Material A and washed off with trifluorotoluene without reacting the RSA in the oven. The contact angle of the oven-cured RSA surface was 27 degrees. This demonstrates that the RSA can be applied and removed without affecting the underlying surface energy, and the difference vs. the cured film can be readily measured.

Example 3

Example 3 demonstrates an RSA treatment that is subsequent to the formation of the first layer. The first layer is an organic active layer.

Glass slides were coated with Material A and thermally cured as described above. On some slides the Material A was overcoated with a solution of RSA (Zonyl® TA-N) as described above, and the RSA was dried at ambient. The thickness of the RSA coating was determined to be about 100 Angstrom (Å) using a VEECO NT3300 inteferometric profilometer. The RSA was exposed to actinic radiation (365-405 nm, 2.7 Joule/cm^2) in air; half this glass slide was masked off to prevent exposure. After exposure the uncured RSA was washed off by soaking in trifluorotoluene for 3 minutes. The contact angle of anisole on the region where the RSA had been exposed to actinic radiation was 40 degrees. The contact angle in the unexposed region was identical to Material A within experimental error, showing the unexposed RSA was completely soluble and could be rinsed cleanly from the Material A surface. A coating of Material A without RSA was exposed to actinic radiation and the contact angle was unchanged. This demonstrates creating a pattern in the RSA by exposure to actinic radiation, and the change in surface energy is due to the RSA and not to the processing steps.

Example 4

Example 4 demonstrates an RSA treatment that is subsequent to the formation of the first layer. This example also demonstrates containment as it would be practiced during printing of an emissive ink. The example is shown in FIGS. 3 through 6.

Figure 3:
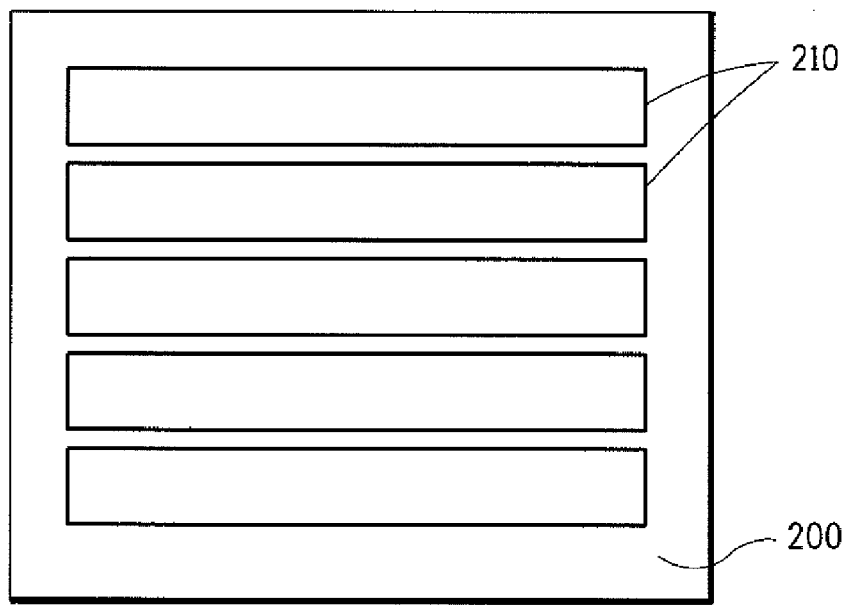
FIG. 3 includes an illustration of a substrate with anode lines.
Figure 4:
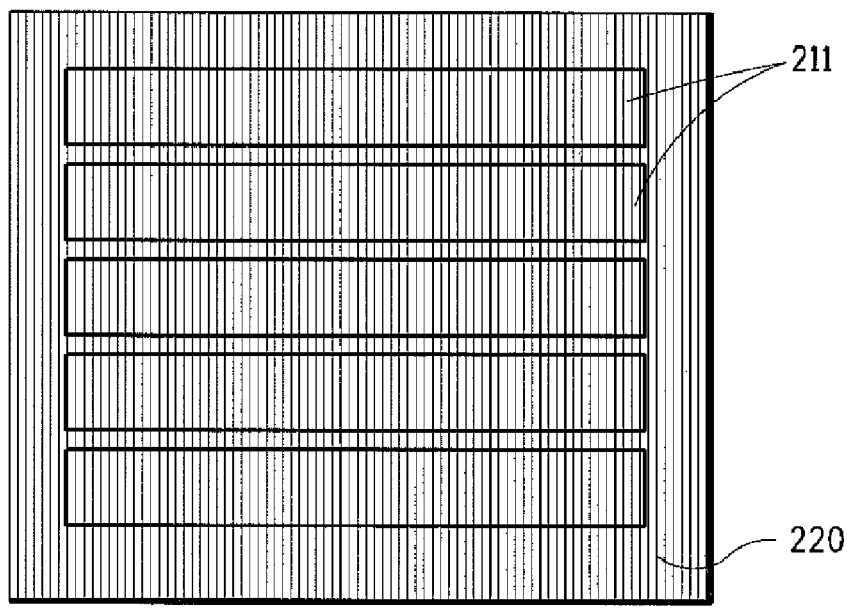
FIG. 4 includes an illustration of the substrate of FIG. 3 coated with a buffer material.
Figure 5:
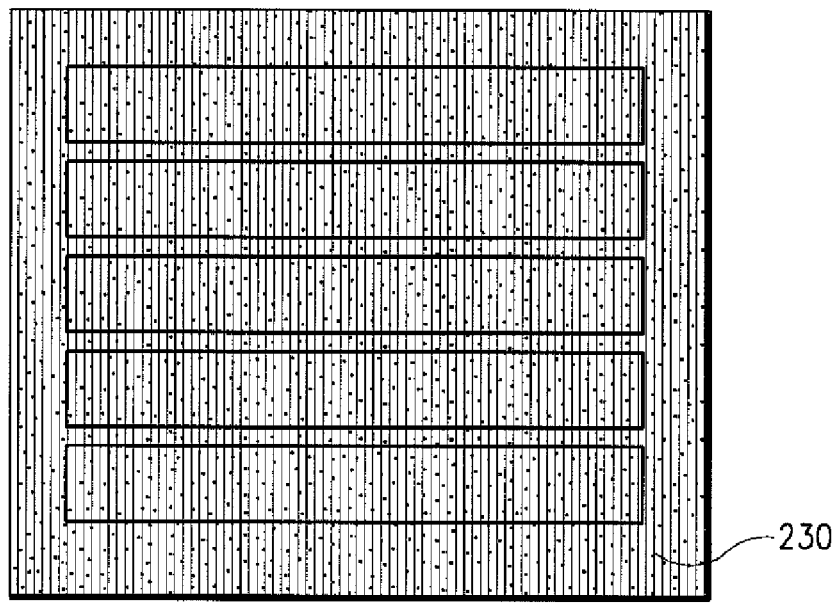
FIG. 5 includes an illustration of the substrate of FIG. 4 further coated with a reactive surface-active composition.
Figure 6:
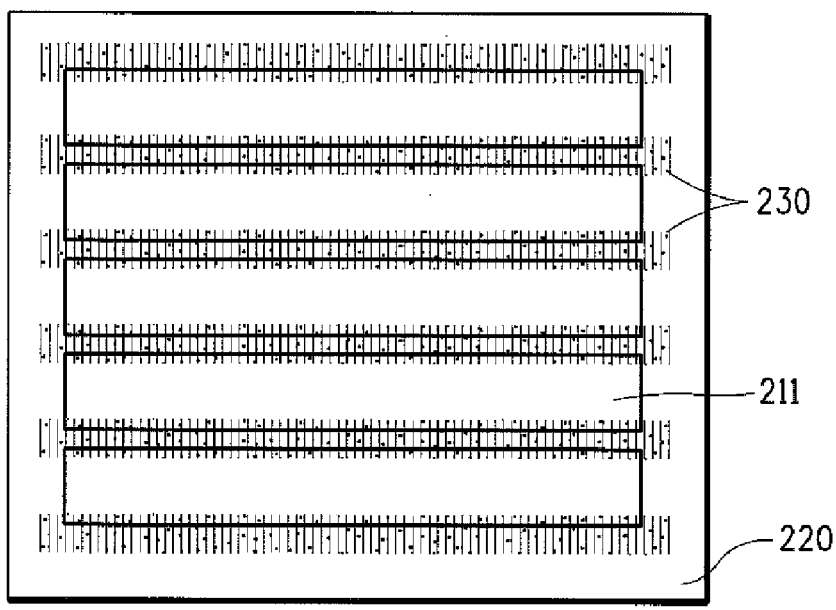
FIG. 6 includes an illustration of the substrate of FIG. 5 after exposure and development.

A glass substrate, shown as 200 in FIG. 3, with a coating of indium tin oxide (ITO) about 1100 Å thick, was patterned photolithographically to create an array of lines of ITO, shown as 210, with widths of about 90 microns, and spacing of 10 microns between the lines. A layer 220 of Material A was coated over the array of lines and cured at 200° C. in a convection oven with an nitrogen atmosphere for 30 minutes, as shown in FIG. 4. The Material A-coated ITO lines are shown as 211. A coating 230 of Zonyl® TA-N was applied over the Material A on one substrate by spin coating from hexafluoropropoxybenzene, and dried in air, as shown in FIG. 5. This coating was exposed to radiation from a source with the majority of its emission in the range of 365-404 nm using a negative photomask so the exposed regions covered the gaps between the ITO lines, and 2-3 microns of the edge of the ITO line. The exposure was about 3.8 J/cm^2. The plates were washed in trifluorotoluene to remove the unexposed RSA. FIG. 6 shows the piece after development, with RSA-covered areas 230 and Material A-covered areas over the ITO, 211 and Material A-covered areas over the glass, 220. An emissive ink comprising BH119 and BH215 (both from Idemitsu) in a ratio of 8:92, at 1.5% total solids, in anisole, was printed onto the ITO lines using a MicroFab printer, at ambient. The drop volume was about 40-45 picoliters, and the drop spacing was 0.08 mm, creating continuous lines of printing. On the panel without the RSA the printed lines spread about 200-300 microns; that is, the ink spread across 3 ITO lines. This would have resulted in unacceptable color mixing in an actual printing process. On the panel with the patterned RSA the ink was contained entirely within the region treated with the RSA, and would have resulted in a high quality printed device.

Example 5

Example 5 demonstrates an RSA treatment that is subsequent to the formation of the first layer.

Coatings of Material A were prepared and thermally cured as described above. These were then overcoated with RSA coatings of Zonyl® TA-N as described above. The RSA coatings received blanket exposures up to about 4 J/cm^2. The coatings were washed in trifluorotoluene after exposure, and contact angles were measured with anisole. The anisole contact angle was modulated from about 9 degrees (Material A surface) to 40-45 degrees. No significant difference was observed if the exposures were performed in air or an inert atmosphere.

Example 6

Example 6 demonstrates an RSA treatment that is subsequent to the formation of the first layer, where removal of unexposed region is accomplished via sublimation.

Coatings of Material A were prepared and thermally cured as described above. These were then overcoated with RSA coatings of heneicosafluorododecylacrylate by spin coating from a 3% wt/vol solution in perfluorooctane. One of the RSA coatings received a blanket UV exposure of about 1.5 J/cm$^2$; the other coating did not receive a UV exposure. The two coatings were baked at 195° C. for 20 minutes on a hot plate in air, and contact angles were measured with anisole. The anisole contact angle was about 55 degrees on the RSA coating that had been exposed to UV radiation. The anisole contact angle was 10 degrees on the coating that had not been exposed to UV radiation. This demonstrates that the RSA that has not been exposed to UV radiation can be removed by heating. If the RSA coating had been exposed to UV radiation in a pattern, and then heated, the RSA would have remained in the exposed areas with a contact angle of about 55 degrees, and the unexposed areas would have had a contact angle of about 10 degrees.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A process for forming a contained second layer over a first layer, said process comprising:
    forming the first layer having a first surface energy;
    treating the first layer with a reactive surface-active composition to form a treated first layer having a second surface energy which is lower than the first surface energy;
    exposing the treated first layer with radiation, wherein the radiation is applied in a pattern to form exposed regions and unexposed regions of the reactive surface-active composition;
    removing either the exposed or unexposed regions of the reactive surface-active composition by treating with a liquid; and
    forming the second layer.

2. The process of claim 1 wherein the reactive surface-active composition is a fluorinated material.

3. The process of claim 1, wherein the reactive surface-active composition is a radiation-hardenable material and the unexposed regions are removed.

4. The process of claim 1, wherein the reactive surface-active composition is a crosslinkable fluorinated surfactant.

5. The process of claim 1, wherein the surface-active composition to form a treated first layer having a second surface energy is applied as a separate layer.

6. A process for making an organic electronic device comprising a first organic active layer and a second organic active layer positioned over an electrode, said process comprising
    forming the first organic active layer having a first surface energy over the electrode,
    treating the first organic active layer with a reactive surface-active composition to form a treated first organic active layer having a second surface energy which is lower than the first surface energy,
    exposing the treated first organic active layer with radiation, wherein the radiation is applied in a pattern to form exposed regions and unexposed regions of the reactive surface-active composition,
    removing either the exposed or unexposed regions of the reactive surface-active composition by treating with a liquid; and
    forming the second organic active layer.

* * * * *